(12) United States Patent
Hara et al.

(10) Patent No.: US 10,314,158 B2
(45) Date of Patent: Jun. 4, 2019

(54) SHIELDING BODY, AND SUPERCONDUCTING ACCELERATOR

(71) Applicant: MITSUBISHI HEAVY INDUSTRIES MACHINERY SYSTEMS, LTD., Hyogo (JP)

(72) Inventors: Hiroshi Hara, Tokyo (JP); Katsuya Sennyu, Tokyo (JP)

(73) Assignee: MITSUBISHI HEAVY INDUSTRIES MACHINERY SYSTEMS, LTD., Hyogo (JP)

( * ) Notice: Subject to any disclaimer, the term of this patent is extended or adjusted under 35 U.S.C. 154(b) by 0 days.

(21) Appl. No.: 15/576,595

(22) PCT Filed: May 19, 2016

(86) PCT No.: PCT/JP2016/064913
§ 371 (c)(1),
(2) Date: Nov. 22, 2017

(87) PCT Pub. No.: WO2016/194635
PCT Pub. Date: Dec. 8, 2016

(65) Prior Publication Data
US 2018/0153028 A1    May 31, 2018

(30) Foreign Application Priority Data

May 29, 2015    (JP) ................. 2015-110877

(51) Int. Cl.
*H05H 7/20*    (2006.01)
*G12B 17/06*    (2006.01)
(Continued)

(52) U.S. Cl.
CPC ............... *H05H 7/20* (2013.01); *G12B 17/02* (2013.01); *G12B 17/04* (2013.01); *G12B 17/06* (2013.01); *H05K 9/00* (2013.01)

(58) Field of Classification Search
None
See application file for complete search history.

(56) References Cited

U.S. PATENT DOCUMENTS

| 2002/0024338 A1* | 2/2002 | Saho ................ F17C 3/085 324/248 |
| 2004/0061066 A1* | 4/2004 | Harada ............. H01J 37/147 250/396 ML |
| 2006/0205177 A1* | 9/2006 | Smith ................ H01L 23/5225 438/455 |

(Continued)

FOREIGN PATENT DOCUMENTS

| EP | 0424835 A2 | 5/1991 |
| JP | 2-114598 A | 4/1990 |

(Continued)

OTHER PUBLICATIONS

International Search Report in PCT/JP2016/064913, dated Aug. 23, 2016. 4pp.

(Continued)

*Primary Examiner* — Crystal L Hammond
(74) *Attorney, Agent, or Firm* — Kanesaka Berner and Partners, LLP

(57) ABSTRACT

This shielding body for shielding from geomagnetism and radiant heat comprises: a magnetic shield portion having a plate shape formed from a magnetic body; and a radiation shield portion formed as a film on at least one among outer and inner surfaces in the magnetic shield portion, and formed from a material having a greater heat conductivity than the magnetic body.

6 Claims, 4 Drawing Sheets

(51) Int. Cl.
  *G12B 17/02*  (2006.01)
  *G12B 17/04*  (2006.01)
  *H05K 9/00*  (2006.01)

(56) References Cited

U.S. PATENT DOCUMENTS

| | | | |
|---|---|---|---|
| 2007/0184285 A1* | 8/2007 | Tran .................. | B32B 15/017 |
| | | | 428/432 |
| 2008/0089104 A1* | 4/2008 | Tanaka ............... | G11C 13/0004 |
| | | | 365/53 |
| 2009/0184252 A1* | 7/2009 | Tanaka ................ | G01T 1/1606 |
| | | | 250/370.09 |
| 2010/0200594 A1* | 8/2010 | Husband ............ | G01R 33/3804 |
| | | | 220/560.13 |
| 2011/0136674 A1* | 6/2011 | Yamaguchi ............ | H01L 39/14 |
| | | | 505/231 |

FOREIGN PATENT DOCUMENTS

| | | |
|---|---|---|
| JP | 2-114599 A | 4/1990 |
| JP | 5-45016 A | 2/1993 |
| JP | 5-109497 A | 4/1993 |
| JP | 6-289200 A | 10/1994 |
| JP | 7-245426 A | 9/1995 |
| JP | 7-335399 A | 12/1995 |
| JP | 8-288100 A | 11/1996 |
| JP | 2009-175117 A | 8/2009 |
| WO | 2014125694 A1 | 8/2014 |

OTHER PUBLICATIONS

Written Opinion of the International Searching Authority in International Patent Application No. PCT/JP2016/064913, dated Aug. 23, 2016. 9pp.

* cited by examiner

SHIELDING BODY, AND SUPERCONDUCTING ACCELERATOR

RELATED APPLICATIONS

The present application is a National Phase of PCT/JP2016/064913, filed May 19, 2016, and claims priority based on Japanese Patent Application No. 2015-110877, filed May 29, 2015.

TECHNICAL FIELD

The present invention relates to a shielding body which shields against radiant heat and geomagnetism, and a superconducting accelerator provided with the shielding body.

Priority is claimed on Japanese Patent Application No. 2015-110877 filed on May 29, 2015, the content of which is incorporated herein by reference.

BACKGROUND ART

In the related art, a superconducting accelerator which accelerates charged particles such as electrons or protons by using a superconducting acceleration cavity is known.

Such a superconducting accelerator is disclosed in, for example, PTL 1. In the superconducting accelerator, a superconducting acceleration cavity formed of a superconducting material is cooled by a refrigerant such as liquid helium and made to be superconductive, whereby electric resistance becomes almost zero, so that the acceleration of charged particles is efficiently performed with small electric power.

Incidentally, in the superconducting accelerator, a magnetic shield for shielding against geomagnetism which adversely affects the superconducting characteristics in the superconducting acceleration cavity, and a radiation shield for suppressing the incidence of radiant heat from the outside on the superconducting acceleration cavity are provided so as to cover the superconducting acceleration cavity.

The magnetic shield is usually configured of a magnetic body and performs shielding by bypassing and absorbing the magnetism in a shield space. The radiation shield is cooled with a refrigerant (liquid helium, liquid nitrogen, or the like) and absorbs the radiant heat just before the superconducting accelerator.

CITATION LIST

Patent Literature

[PTL 1] Japanese Unexamined Patent Application Publication No. 7-245426

SUMMARY OF INVENTION

Technical Problem

Incidentally, presently, from the viewpoint of expansion of the use of the superconducting accelerator, manufacturing costs, and construction costs, downsizing of a vacuum vessel and an accelerator is required.

However, if the vacuum vessel is downsized, the magnetic shield and the radiation shield must be installed in a very narrow space (or a limited space). In this case, if a load is applied to the magnetic shield, so that deformation occurs therein, there is a case where a shield property changes. For this reason, when installing the magnetic shield and the radiation shield, sufficient attention is required for handling and it is desirable to be able to easily install the shields.

Therefore, the present invention provides a shielding body in which it is possible to obtain a sufficient shield property while attaining space-saving and simplified handling, and a superconducting accelerator provided with the shielding body.

Solution to Problem

A shielding body according to a first aspect of the present invention includes: a magnetic shield portion having a plate shape and formed of a magnetic body; and a radiation shield portion formed as a film on at least one of inner and outer surfaces in the magnetic shield portion and formed of a material having a greater thermal conductivity than the magnetic body.

By covering an object with such a shielding body, the influence of geomagnetism on this object can be reduced by the magnetic shield portion. Further, by providing the radiation shield portion on the surface of the magnetic shield portion, incidence of radiant heat from the outside on the object covered with the shielding body can be suppressed.

Further, the radiation shield portion is formed as a film on the magnetic shield portion, whereby the radiation shield portion can be very thinly and easily provided. Therefore, as compared with a case where the magnetic shield portion and the radiation shield portion are separately provided, the thickness dimension of the entirety of the shielding body can be reduced and handling also becomes easy.

In a case where a shielding body is formed by separately manufacturing a magnetic shield portion and a radiation shield portion made of different materials and sticking them to each other, if the shielding body is cooled, thermal stress is generated in the magnetic shield portion and the radiation shield portion due to a difference in thermal contraction amount. As a result, a problem such as warping of the shielding body arises.

On the other hand, in the present invention, the radiation shield portion is formed into a film shape, and therefore, even if the thermal deformation amount differs between the magnetic shield portion and the radiation shield portion, the radiation shield portion is easily deformed and the radiation shield portion can easily follow the deformation of the magnetic shield portion.

Further, if the radiation shield portions made of the same material are formed on the inner and outer surfaces of the magnetic shield portion, the thermal shrinkage of the inner and outer surfaces of the magnetic shield is balanced, and thus it is possible to further enhance the effect of suppressing deformation such as warping of the shielding body.

Further, the radiation shield portion is formed by film formation, whereby labor of sticking the magnetic shield portion and the radiation shield portion to each other can be reduced and a fastener or the like which is needed at the time of the sticking is not required. Therefore, it is possible to reduce the number of parts of the shielding body.

Further, the radiation shield portion is formed by film formation, whereby the adhesiveness between the radiation shield portion and the magnetic shield portion is improved, and thus the shielding body can be efficiently and uniformly cooled.

Further, the radiation shield portion is formed by film formation, whereby the radiation shield portion can be easily provided in an arbitrary range on the inner and outer surfaces of the magnetic shield portion.

Further, in a shielding body according to a second aspect of the present invention, the magnetic shield portion may have a larger thickness dimension than the radiation shield portion.

In this manner, the magnetic shield portion is formed to be thicker than the radiation shield portion, that is, the radiation shield portion is formed thinly, whereby the radiation shield portion can sufficiently follow the thermal deformation of the magnetic shield portion, and thus it is possible to suppress deformation such as warping of the shielding body.

Further, in a shielding body according to a third aspect of the present invention, the magnetic shield portion may be formed with a thickness dimension of three times or more the thickness dimension of the radiation shield portion.

By forming the magnetic shield portion with such a thickness dimension, that is, by sufficiently thinly forming the radiation shield portion, in a case where aluminum, silver, gold, or copper is used for the radiation shield portion, the radiation shield portion can sufficiently follow the thermal deformation of the magnetic shield portion, and thus it is possible to suppress deformation such as warping of the shielding body.

Further, in a shielding body according to a fourth aspect of the present invention, the radiation shield portion may be formed to be separated into a plurality of parts at intervals in one direction along each of the inner and outer surfaces in the magnetic shield portion.

In this manner, the radiation shield portions are formed at intervals on the inner and outer surfaces of the magnetic shield portion, whereby as compared with a case where the radiation shield portions are formed on the entire inner and outer surfaces of the magnetic shield, the radiation shield portion is easily deformed and easily follows the thermal deformation of the magnetic shield portion. Accordingly, it is possible to further suppress deformation such as warping of the shielding body.

Further, in a shielding body according to a fifth aspect of the present invention, the magnetic shield portions and the radiation shield portions each formed on each of the magnetic shields may be provided to be separated into a plurality of sets in one direction along each of the inner and outer surfaces, and the sets adjacent to each other may be provided so as to partially overlap when viewed from a direction of geomagnetism.

In this manner, the magnetic shield portions and the radiation shields are provided to be separated into a plurality of sets, whereby when the shielding body is thermally deformed, the overlapping amount between the separated sets changes.

That is, each set moves so as to slide, whereby an amount corresponding to the thermal deformation can be absorbed. Therefore, it is possible to further suppress deformation such as warping of the shielding body when the shielding body is thermally deformed.

Further, in a shielding body according to a sixth aspect of the present invention, the radiation shield portion may be formed on at least one of the inner and outer surfaces so as to form a plurality of layers, and a difference in thermal deformation amount between each of the layers and the magnetic shield portion may increase in stages with increasing distance from the inner and outer surfaces.

In this manner, a difference in thermal deformation amount between each layer of the radiation shield portion and the magnetic shield portion increases as each layer of the radiation shield portion is separated from each of the inner and outer surfaces of the magnetic shield portion, whereby even if a difference in thermal deformation amount between the magnetic shield portion and the layer of the radiation shield portion farthest from the magnetic shield portion is large, it is possible to reduce a difference in thermal deformation amount between the magnetic shield portion and the layer of the radiation shield portion closest to the magnetic shield portion (the layer of the radiation shield portion, which is in contact with each of the inner and outer surfaces of the magnetic shield portion).

Therefore, it is possible to suppress thermal stress in the radiation shield portion and the magnetic shield portion, and it is possible to further suppress deformation such as warping or the like of the shielding body.

A superconducting accelerator according to a seventh aspect of the present invention includes: a superconducting acceleration cavity which forms a space in which a charged particle beam is accelerated; a refrigerant tank which is disposed on the outer periphery side of the superconducting acceleration cavity and forms a refrigerant space which is filled with a refrigerant for cooling the superconducting acceleration cavity, between the refrigerant tank and the superconducting acceleration cavity; and the shielding body according to any one of the first to fifth aspects, which is disposed on the outer periphery side of the refrigerant tank and covers the refrigerant tank and the superconducting acceleration cavity.

According to such a superconducting accelerator, the superconducting accelerator is provided with the shielding body described above, whereby the influence of geomagnetism on the superconducting acceleration cavity can be reduced by the magnetic shield portion.

Further, due to the radiation shield portion, a temperature rise in the superconducting acceleration cavity and the refrigerant tank due to radiant heat from the outside can be suppressed and a state where the superconducting acceleration cavity is cooled can be maintained.

Further, the radiation shield portion is formed as a film on the magnetic shield portion, whereby the radiation shield portion can be very thinly and easily provided, so that the thickness dimension of the entirety of the shielding body can be reduced.

Further, in the present invention, the radiation shield portion has a film shape, and therefore, even if the thermal deformation amount differs between the magnetic shield portion and the radiation shield portion, the radiation shield portion can easily follow the deformation of the magnetic shield portion.

Further, if the radiation shield portions are formed on both the inner and outer surfaces of the magnetic shield portion, the thermal shrinkage of the inner and outer surfaces of the magnetic shield is balanced, and thus it is possible to further suppress deformation such as warping of the shielding body.

Further, the radiation shield portion is formed by film formation, whereby it is possible to reduce labor of sticking the magnetic shield portion and the radiation shield portion to each other, or to reduce the number of parts of the shielding body.

Further, the radiation shield portion is formed by film formation, whereby the adhesiveness between the radiation shield portion and the magnetic shield portion is improved, and thus the shielding body can be efficiently and uniformly cooled. Further, the radiation shield portion is formed by film formation, whereby the radiation shield portion can be easily provided in an arbitrary range on the inner and outer surfaces of the magnetic shield portion.

Advantageous Effects of Invention

According to the shielding body relating to the present invention, the radiation shield portion is formed as a film on the magnetic shield portion, whereby it is possible to obtain a sufficient shield property while attaining space-saving and simplified handling.

DESCRIPTION OF EMBODIMENTS

Hereinafter, some embodiments of the present invention will be described with reference to the accompanying drawings.

First Embodiment

Hereinafter, a superconducting accelerator 1 in a first embodiment of the present invention will be described.

Figure 1:
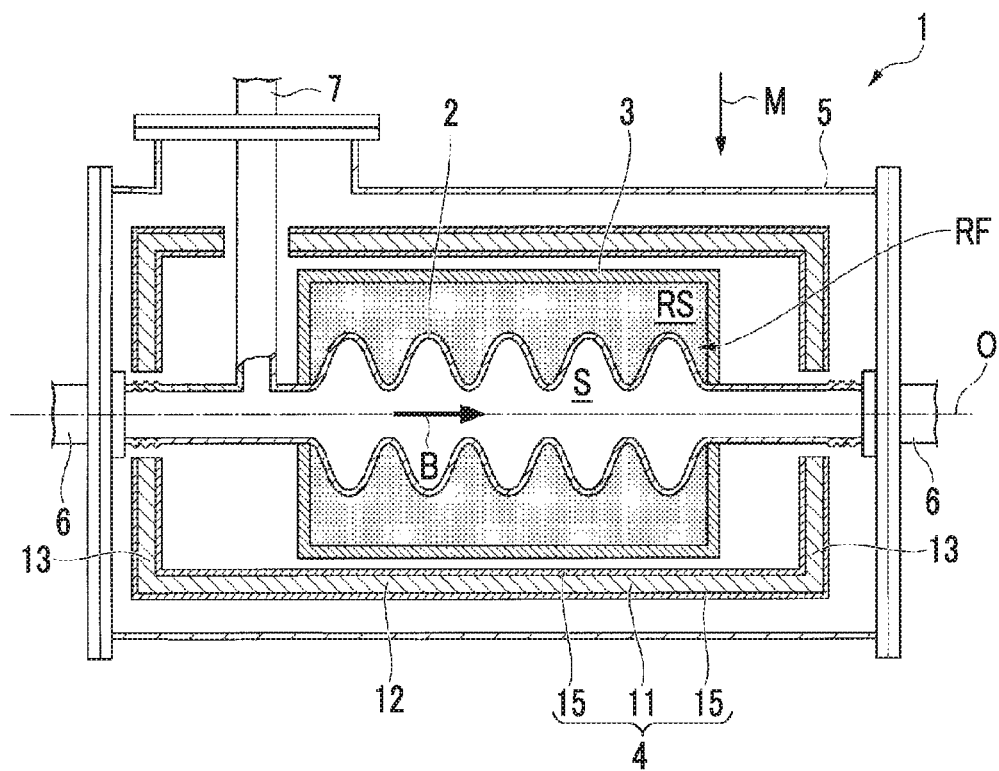
FIG. 1 is a schematic overall view of a superconducting accelerator in a first embodiment of the present invention.
Figure 2:
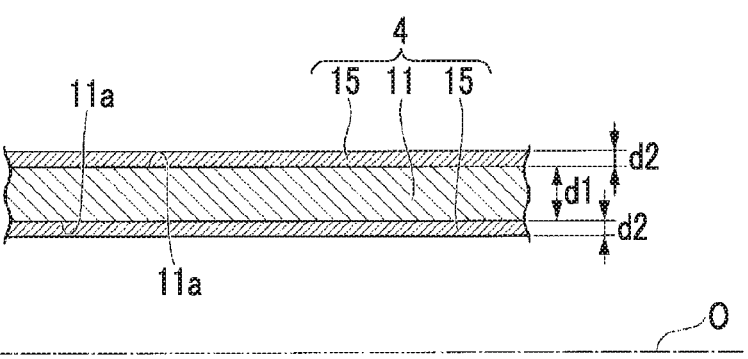
FIG. 2 is an enlarged view of a main section of a shielding body in the superconducting accelerator in the first embodiment of the present invention.

As shown in FIG. 1, the superconducting accelerator 1 is provided with a superconducting acceleration cavity 2 in which a charged particle beam B is accelerated, a refrigerant tank 3 which covers the superconducting acceleration cavity 2, a shielding body 4 which covers the superconducting acceleration cavity 2 and the refrigerant tank 3, and a vacuum vessel 5 which accommodates the superconducting acceleration cavity 2, the refrigerant tank 3, and the shielding body 4.

The superconducting acceleration cavity 2 has a substantially tubular shape centered on an axis line O and extends in a direction of the axis line O with the outer surface having a shape in which diameter expansion and diameter reduction are repeated. A space S in which diameter expansion and diameter reduction are repeated so as to correspond to the shape of the outer surface of the superconducting acceleration cavity 2 is formed in the superconducting acceleration cavity 2. The charged particle beam B passes through the space S.

Further, the superconducting acceleration cavity 2 is formed of a superconducting material. As an example of the superconducting material, niobium can be exemplified. Other superconducting materials can also be used for the superconducting acceleration cavity 2, and for example, a high-temperature superconductor or the like may be used.

Beam pipes 6 are connected to the superconducting acceleration cavity 2 at both ends of the axis line O such that the charged particle beam B can pass through the space S.

The beam pipe 6 is configured of a superconducting material such as niobium, similar to the superconducting acceleration cavity 2.

The refrigerant tank 3 has a tubular shape centered on the axis line O and is disposed on the outer periphery side of the superconducting acceleration cavity 2 such that a refrigerant space RS which is filled with a refrigerant RF is defined between the refrigerant tank 3 and the outer surface of the superconducting acceleration cavity 2.

The refrigerant RF is, for example, liquid helium or the like and is capable of cooling the superconducting acceleration cavity 2 to an extremely low temperature. The refrigerant tank 3 is provided with an opening portion (not shown) allowing the refrigerant RF to be supplied into the refrigerant space RS and allowing the refrigerant RF to be discharged from the refrigerant space RS.

The type of the refrigerant RF is not limited to liquid helium and can be appropriately selected according to the material of the superconducting acceleration cavity 2.

Further, an input coupler 7 is mounted outside the refrigerant tank 3 at an end portion on one side (the left side as viewed in FIG. 1) in the direction of the axis line O of the superconducting acceleration cavity 2 inside of the refrigerant tank 3.

Electric power is supplied from the input coupler 7 to the superconducting acceleration cavity 2. An electric field for accelerating the charged particle beam B is generated in the space S in the superconducting acceleration cavity 2 by the electric power from the input coupler 7.

The vacuum vessel 5 has a tubular shape centered on the axis line O. The vacuum vessel 5 makes the beam pipes 6 penetrate in the direction of the axis line O at both ends in the direction of the axis line O, and the inside of the vacuum vessel 5 is maintained in a vacuum state so as to perform the thermal insulation of the superconducting acceleration cavity 2 and the refrigerant tank 3.

Next, the shielding body 4 will be described in detail.

The shielding body 4 has a tubular shape centered on the axis line O and is disposed between the outer surface of the refrigerant tank 3 and the inner surface of the vacuum vessel 5. Further, the input coupler 7 extending from the superconducting acceleration cavity 2 penetrates the shielding body 4.

Further, the shielding body 4 is provided with a magnetic shield portion 11 having a plate shape and formed of a magnetic body (a so-called ferromagnetic body), and radiation shield portions 15 formed as a film on inner and outer surfaces 11a of the magnetic shield portion 11.

The magnetic shield portion 11 is configured of a material such as Permalloy (registered trademark), for example. The magnetic shield portion 11 has a tubular portion 12 having a tubular shape centered on the axis line O, and flange-like portions 13 protruding radially inward at both ends in the direction of the axis line O in the tubular portion 12. The magnetic shield portion 11 also surrounds a part of the refrigerant tank 3 from the direction of the axis line O with the flange-like portion 13.

The magnetic shield portion 11 reduces the influence of geomagnetism M which is exerted on the superconducting acceleration cavity 2 from the outside of the superconducting accelerator 1.

A thickness dimension d1 of the magnetic shield portion 11 is preferably 1 mm or more and 2 mm or less, for example. The thickness dimension d1 of the magnetic shield portion 11 is set to be within such a range, whereby it is possible to sufficiently obtain the effect of shielding against the geomagnetism M.

The radiation shield portion 15 is configured of a material having a thermal conductivity greater than the thermal conductivity of the magnetic body configuring the magnetic shield portion 11.

The radiation shield portion 15 is provided as a film integrally with the magnetic shield portion 11 by depositing a metal material such as copper, gold, silver, or aluminum on the inner and outer surfaces 11a by sputtering or the like so as to cover the entirety of the tubular portion 12 and the flange-like portions 13 of the magnetic shield portion 11.

In the first embodiment, as an example, a case where the radiation shield portions 15 made of the same material are provided on the inner and outer surfaces 11a is exemplified. However, for example, the radiation shield portions 15 made of different materials on the inner and outer surfaces 11a may be provided.

Here, the thermal conductivity of Permalloy (registered trademark) is about 30 [W/(m·K)], whereas the thermal conductivity of copper (pure copper) is 332 [W/(m·K)], the thermal conductivity of gold is 254 [W/(m·K)], the thermal conductivity of silver (pure silver) is 360 [W/(m·K)], and the thermal conductivity of aluminum is 175 [W/(m·K)].

That is, the thermal conductivity of the radiation shield portion 15 is about ten times greater than the thermal conductivity of the magnetic shield portion 11. The value of the thermal conductivity described above is a value at a temperature of 20 [° C.]. However, also under the condition in a range of −269° C. to −196° C. in which the superconducting accelerator 1 of the first embodiment is operated, the thermal conductivity of the radiation shield portion 15 is likewise greater than the thermal conductivity of the magnetic shield portion 11.

The radiation shield portion 15 suppresses the incidence of the radiant heat from the outside of the superconducting accelerator 1 on the superconducting acceleration cavity 2 and the refrigerant tank 3. From the viewpoint of sufficiently performing heat shielding, a thickness dimension d2 of the radiation shield portion 15 is preferably about 100 μm or more and about 200 μm or less.

According to the superconducting accelerator 1 of the first embodiment, due to covering the superconducting acceleration cavity 2 and the refrigerant tank 3 with the shielding body 4, the influence of the geomagnetism M which is exerted on the superconducting acceleration cavity 2 can be reduced by the magnetic shield portion 11.

Further, a temperature rise in the superconducting acceleration cavity 2 and the refrigerant tank 3 can be suppressed by the radiation shield portion 15, and thus the superconducting acceleration cavity 2 can be sufficiently cooled, and a state where the superconducting acceleration cavity 2 is cooled to a predetermined temperature can be maintained.

Further, the radiation shield portion 15 is formed as a film on the magnetic shield portion 11, whereby it is possible to very thinly and easily provide the radiation shield portion 15.

Therefore, as compared with a case where the magnetic shield portion 11 and the radiation shield portion 15 are separately provided, the thickness dimension of the entirety of the shielding body 4 can be reduced and handling also becomes easy.

That is, it is possible to attain space-saving and simplified handling of the shielding body 4. Further, when the shielding body 4 is provided in the vacuum vessel 5, it is possible to suppress deformation when installing the shielding body 4 in a narrow installation space. Accordingly, during the operation of the superconducting accelerator 1, it is possible to sufficiently obtain a shield property in the shielding body 4.

Here, when, at the time of the start of operation of the superconducting accelerator 1, the refrigerant RF is filled in the refrigerant tank 3, so that the cooling of the superconducting acceleration cavity 2 is started, or when, at the time of the end of operation of the superconducting accelerator 1, the refrigerant RF is discharged from the refrigerant tank 3, so that the cooling of the superconducting acceleration cavity 2 is ended, the temperature of the shielding body 4 changes.

In this case, the materials of the magnetic shield portion 11 and the radiation shield portion 15 are different from each other, whereby the thermal deformation amount (thermal expansion amount or thermal contraction amount) becomes different between the magnetic shield portion 11 and the radiation shield portion 15.

In such a case, if the magnetic shield portion 11 and the radiation shield portion 15 are separately manufactured and the shielding body 4 is formed by sticking the magnetic shield portion 11 and the radiation shield portion 15 to each other using, for example, bolts or the like so as to laminate them, thermal stress is generated in the magnetic shield portion 11 and the radiation shield portion 15, and thus there is a possibility that a problem such as warping of the shielding body 4 may occur.

On the other hand, in the superconducting accelerator 1 of the first embodiment, the radiation shield portion 15 is formed into a thin film shape, and therefore, the radiation shield portion 15 is easily deformed. Accordingly, even if the thermal deformation amount differs between the magnetic shield portion 11 and the radiation shield portion 15, the radiation shield portion 15 can easily follow the deformation of the magnetic shield portion 11.

As a result, it is difficult for deformation such as warping of the shielding body 4 to occur according to the temperature change of the shielding body 4, and a sufficient shield property in the shielding body 4 can be maintained.

Further, in the first embodiment, the radiation shield portions 15 configured of the same material are disposed on the inner and outer surfaces 11a of the magnetic shield portion 11, and therefore, the forces (forces causing thermal stress) that the inner and outer surfaces 11a of the magnetic shield portion 11 receive from the radiation shield portions 15 at the time of the temperature change of the shielding body 4 are equalized.

That is, the thermal stress which is generated by the force acting on the surface 11a on one side of the magnetic shield portion 11 and the thermal stress which is generated by the force acting on the surface 11a on the other side of the magnetic shield portion 11 are balanced. As a result, the warping or the like of the shielding body 4 due to a difference in thermal deformation amount between the magnetic shield portion 11 and the radiation shield portion 15 can be further suppressed.

Figure 3:
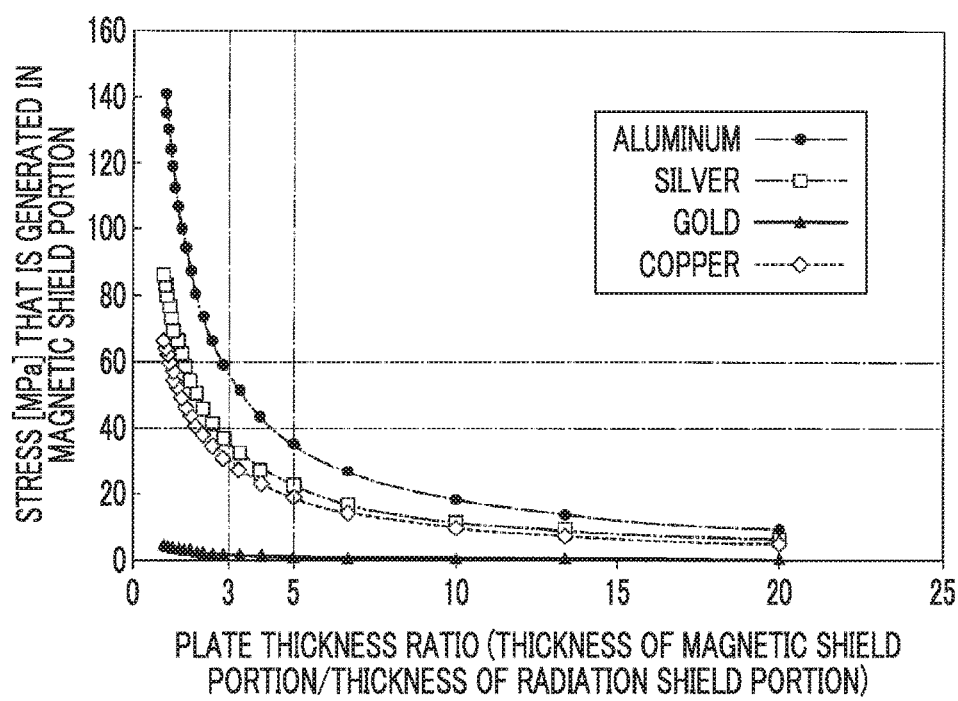
FIG. 3 is a graph showing the relationship between the thickness dimension ratio of a magnetic shield portion to a radiation shield portion in the superconducting accelerator in the first embodiment of the present invention and thermal stress which is generated in the magnetic shield portion.

Here, FIG. 3 shows the results obtained by calculating the relationship between the ratio of the thickness dimension of the magnetic shield portion 11 to the thickness dimension of the radiation shield portion 15 and the thermal stress which is generated in the magnetic shield portion 11, for each material of the radiation shield portion 15.

In this calculation, parameters were set as follows.

ΔT [° C.]: temperature change in the magnetic shield portion 11 and the radiation shield portion 15 (when the results shown in FIG. 3 are calculated, ΔT was set to be 295 [° C.])

w[mm]: width dimension (length dimension in a direction crossing the axis line O) of each of the magnetic shield portion 11 and the radiation shield portion 15

$t_1$ [mm]: thickness dimension of the magnetic shield portion 11

$A_1$ [mm]: cross-sectional area ($A_1 = w \times t_1$) of the magnetic shield portion 11

$E_1$ [N/mm$^2$]: longitudinal elastic modulus of the material of the magnetic shield portion 11

$\alpha_1$ [1/° C.]: linear expansion coefficient of the material of the magnetic shield portion 11

$t_2$ [mm]: thickness dimension of the radiation shield portion 15

$A_2$ [mm]: cross-sectional area ($A_2 = w \times t_2$) of the radiation shield portion 15

$E_2$ [N/mm]: longitudinal elastic modulus of the material of the radiation shield portion 15

$\alpha_2$ [1/° C.]: linear expansion coefficient of the material of the radiation shield portion 15

The thermal stress σ [MPa] which is generated in the magnetic shield portion 11 was calculated by the following expression (1) using such parameters. It was assumed that the radiation shield portion 15 was formed as a film on the entire surface 11a of the magnetic shield portion 11.

[Expression 1]

$$\sigma = \frac{A_2 E_1 E_2}{A_1 E_1 + A_2 E_2}(\alpha_2 - \alpha_1)\Delta T \quad (1)$$

As a result, as shown in FIG. 3, it can be confirmed that, even in a case where any material other than gold is used for the radiation shield portion 15 in a range in which the ratio $t_1/t_2$ of the thickness dimension of the magnetic shield portion 11 to the thickness dimension of the radiation shield portion 15 is three times or more, the thermal stress a which is generated in the magnetic shield portion 11 is rapidly lowered. Specifically, the thermal stress a which is generated in the magnetic shield portion 11 becomes lower than 60 [MPa] in a range in which $t_1/t_2$ is three times or more, and the thermal stress a which is generated in the magnetic shield portion 11 becomes lower than 40 [MPa] in a range in which the thickness dimension ratio $t_1/t_2$ is five times or more.

Further, in a case where gold is used for the radiation shield portion 15, the thermal stress a which is generated in the magnetic shield portion 11 is lower than 10 [MPa] regardless of the numerical value of $t_1/t_2$.

Therefore, as described above, in the first embodiment, there is no limitation to a case where the thickness dimension d1 of the magnetic shield portion 11 is 1 mm or more and 2 mm or less and the thickness dimension d2 of the radiation shield portion 15 is 100 μm or more and 200 μm or less, and if the thickness dimension of each of the magnetic shield portion 11 and the radiation shield portion 15 is set within a range in which at least the thickness dimension ratio $t_1/t_2$ is at least 3 times or more, more preferably 5 times or more, it becomes possible to sufficiently suppress the thermal deformation of the shielding body 4.

It is favorable if the magnetic shield portion 11 has a larger thickness dimension than the radiation shield portion 15, that is, the radiation shield portion 15 is set to be thinner, in consideration of thermal deformability without being limited to these numerical values.

Further, the radiation shield portion 15 is formed by film formation, whereby labor of sticking the magnetic shield portion 11 and the radiation shield portion 15 to each other can be reduced and a fastener or the like (a bolt or the like) which is needed at the time of the sticking is not required. Therefore, it is possible to reduce the number of parts of the shielding body 4.

Further, the radiation shield portion 15 is formed by film formation, whereby the adhesiveness between the radiation shield portion 15 and the magnetic shield portion 11 is improved, and thus the shielding body 4 can be efficiently and uniformly cooled.

Further, the radiation shield portion 15 is formed by film formation, whereby the radiation shield portion 15 can be easily provided in an arbitrary range on the surface 11a of the magnetic shield portion 11, and thus the degree of freedom of design can be increased.

Second Embodiment

Figure 4:
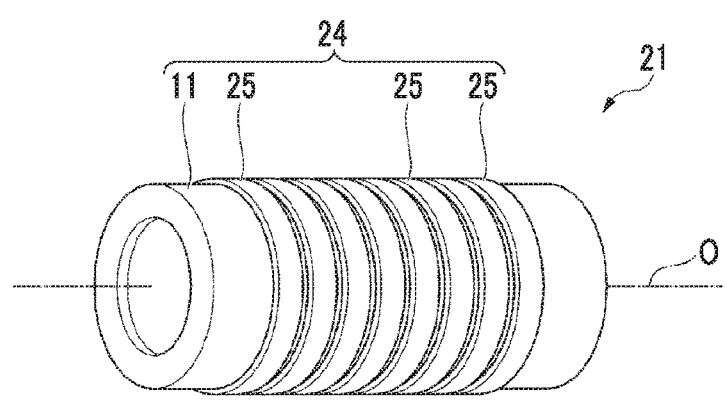
FIG. 4 is an overall perspective view of a shielding body in a superconducting accelerator in a second embodiment of the present invention.

Next, a superconducting accelerator 21 according to a second embodiment of the present invention will be described with reference to FIG. 4.

The same constituent elements as those in the first embodiment are denoted by the same reference numerals and a detailed description thereof is omitted.

In the superconducting accelerator 21 of the second embodiment, a shielding body 24 is different from the shielding body 4 of the first embodiment.

That is, a radiation shield portion 25 in the shielding body 24 is formed to be separated into a plurality of parts at intervals in one direction along the surface 11a in the magnetic shield portion 11.

Specifically, in the second embodiment, a plurality of radiation shield portions 25 each having the form of a ring centered on the axis line O are provided at intervals in the direction of the axis line O.

According to the superconducting accelerator 21 of the second embodiment, the plurality of radiation shield portions 25 are formed to be separated at intervals, whereby when the temperature of the shielding body 24 changes, the radiation shield portions 25 are easily deformed to follow the deformation of the magnetic shield portion 11, as compared with a case where the radiation shield portion 25 is formed on the entire surface 11a of the magnetic shield portion 11.

For this reason, even in a case where the thermal deformation amounts of the radiation shield portion 25 and the magnetic shield portion 11 are different from each other due to the material of the radiation shield portion 25 and the material of the magnetic shield portion 11 being different from each other, it is possible to suppress deformation such as warping of the shielding body 24.

Figure 5:
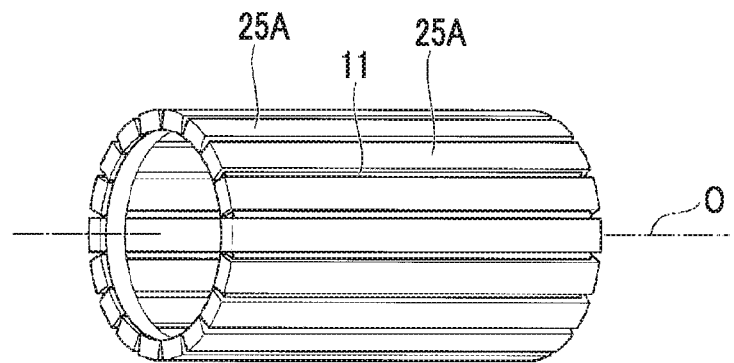
FIG. 5 is an overall perspective view of a shielding body in a superconducting accelerator in a modification example of the second embodiment of the present invention.

Further, as shown in FIG. 5, a radiation shield portion 25A may be formed to be separated into a plurality of parts at intervals in a circumferential direction of the magnetic shield portion 11.

Even in such a case, the radiation shield portion 25A is easily deformed to follow the magnetic shield portion 11, and thus it is possible to suppress deformation such as warping of the shielding body 24.

Third Embodiment

Figure 6:
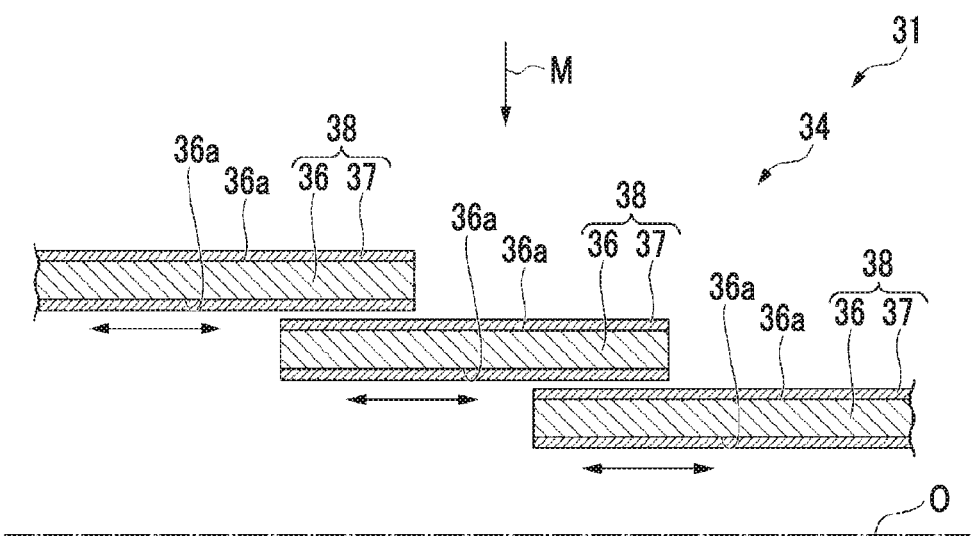
FIG. 6 is an enlarged view of a main section of a shielding body in a superconducting accelerator in a third embodiment of the present invention.

Next, a superconducting accelerator 31 according to a third embodiment of the present invention will be described with reference to FIG. 6. In FIG. 6, the same constituent elements as those in the first embodiment and the second embodiment are denoted by the same reference numerals and a detailed description thereof is omitted.

In the superconducting accelerator 31 of the third embodiment, a shielding body 34 is different from the shielding body 4 of the first embodiment and the shielding body 24 the second embodiment.

That is, magnetic shield portions 36 and radiation shield portions 37 each formed on each of the magnetic shield portions 36 are provided to be separated into a plurality of sets 38 in a direction along a surface 36a of the magnetic shield portion 36, that is, in the direction of the axis line O.

Further, the sets 38 adjacent to each other in the direction of the axis line O are provided so as to partially overlap in a radial direction. In this embodiment, the direction of the geomagnetism M is along the radial direction.

In the superconducting accelerator 31 of the third embodiment, the shielding bodies 34 each having the magnetic shield portion 36 and the radiation shield portion 37 are provided to be separated into the plurality of sets 38, whereby the overlapping amount between the sets 38 changes when the temperature of the shielding body 34 changes.

That is, each set 38 slides to move in the direction of the axis line O (refer to the arrow in FIG. 6), whereby an amount corresponding to the thermal deformation of the shielding body 34 can be absorbed.

Therefore, it is possible to further suppress deformation such as warping of the shielding body 34 when the shielding body 34 is thermally deformed.

Fourth Embodiment

Figure 7:
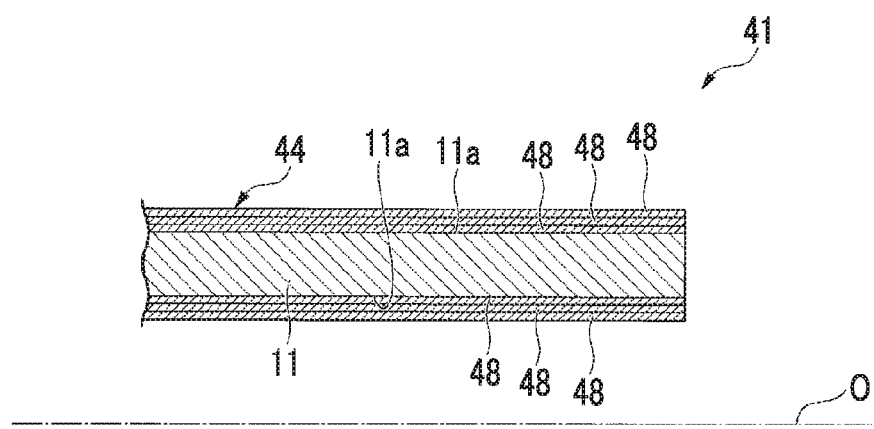
FIG. 7 is an enlarged view of a main section of a shielding body in a superconducting accelerator in a fourth embodiment of the present invention.

Next, a superconducting accelerator 41 according to a fourth embodiment of the present invention will be described with reference to FIG. 7. In FIG. 7, the same constituent elements as those in the first to third embodiments are denoted by the same reference numerals and a detailed description thereof is omitted.

In the superconducting accelerator 41 of the fourth embodiment, a shielding body 44 is different from the shielding body 4 of the first embodiment, the shielding body 24 of the second embodiment, and the shielding body 34 of the third embodiment.

That is, a radiation shield portion 47 of the shielding body 44 is formed on the surface 11a of the magnetic shield portion 11 so as to form a plurality of layers 48, and a material of each layer 48 is determined such that a difference in thermal deformation amount between the magnetic shield portion 11 and the layer 48 increases in stages toward the layer 48 which is separated from the surface 11a.

Specifically, for example, the materials of the respective layers 48 of the radiation shield portion 47 are selected in the order of gold, copper, and aluminum from the magnetic shield portion 11 toward the separation side.

According to the superconducting accelerator 41 of the fourth embodiment, a difference in thermal deformation amount between each layer 48 of the radiation shield portion 47 and the magnetic shield portion 11 increases as each layer 48 is the layer 48 with increasing distance from the surface 11a of the magnetic shield portion 11, whereby even in a case where a difference in thermal deformation amount between the magnetic shield portion 11 and the layer 48 of the radiation shield portion 47 farthest from the magnetic shield portion 11 is large, it is possible to reduce a difference in thermal deformation amount between the magnetic shield portion 11 and the layer 48 of the radiation shield portion 47 closest to the magnetic shield portion 11 (the layer 48 which is in contact with the surface 11a of the magnetic shield portion 11).

Therefore, it is possible to further suppress the warping or the like of the shielding body 44 when the shielding body 44 is deformed due to a temperature.

The embodiments of the present invention have been described in detail above with reference to the drawings. However, the respective configurations in each embodiment, combinations thereof, and the like are examples, additions, omissions, substitutions, and other changes of the configuration can be made within a scope which does not depart from the gist of the present invention, and the present invention is not limited by the embodiments described above.

For example, in the embodiments described above, the radiation shield portions 15, 25, 25A, 37, or 47 are formed on the inner and outer surfaces 11a or 36a of the magnetic shield portion 11 or 36. However, the radiation shield portions may be formed only on the surface on one side of the inner and outer surfaces 11a or 36a.

Further, each of the shield bodies 4, 24, 34, and 44 may be provided to be stuck to the inner surface of the vacuum vessel 5 or may be provided to be separated from the vacuum vessel 5 and the refrigerant tank 3 between the vacuum vessel 5 and the refrigerant tank 3.

Further, the shape of each of the shielding bodies 4, 24, 34, and 44 may be a cylindrical shape or may be a rectangular tubular shape obtained by sticking a plurality of plate-like members to each other. In a case of sticking a plurality of plate-like members to each other, the shield bodies 4, 24, 34, 44 can be formed more easily.

INDUSTRIAL APPLICABILITY

The present invention can be applied to a shielding body for shielding against radiant heat and geomagnetism, and a superconducting accelerator provided with the shielding body.

REFERENCE SIGNS LIST 1, 21, 31, 41: superconducting accelerator
2: superconducting acceleration cavity
3: refrigerant tank
4, 24, 34, 44: shielding body
5: vacuum vessel
6: beam pipe
7: input coupler
11, 36: magnetic shield portion
11a, 36a: surface
12: tubular portion
13: flange-like portion
15, 25, 25A, 37, 47: radiation shield portion
38: set
48: layer
RF: refrigerant
RS: refrigerant space
O: axis line
S: space
B: charged particle beam
M: geomagnetism

The invention claimed is:
1. A shielding body comprising:
a magnetic shield portion having a plate shape and formed of a magnetic body; and
a radiation shield portion formed as a film on at least one of inner and outer surfaces in the magnetic shield portion and formed of a material having a greater thermal conductivity than the magnetic body, wherein each of the magnetic shield portion and the radiation shield portion is provided in a plurality of sets in one direction along each of the inner and outer surfaces, and sets adjacent to each other are provided so as to partially overlap when viewed from a direction of geomagnetism.

2. The shielding body according to claim 1, wherein the magnetic shield portion has a larger thickness dimension than the radiation shield portion.

3. The shielding body according to claim 2, wherein the magnetic shield portion is formed with a thickness dimension of three times or more the thickness dimension of the radiation shield portion.

4. The shielding body according to claim 1, wherein the radiation shield portion is formed to be separated into a plurality of parts at intervals in one direction along each of the inner and outer surfaces in the magnetic shield portion.

5. A superconducting accelerator comprising:
a superconducting acceleration cavity which forms a space in which a charged particle beam is accelerated;
a refrigerant tank which is disposed on the outer periphery side of the superconducting acceleration cavity and forms a refrigerant space which is filled with a refrigerant for cooling the superconducting acceleration cavity, between the refrigerant tank and the superconducting acceleration cavity; and
the shielding body according to claim 1, which is disposed on the outer periphery side of the refrigerant tank and covers the refrigerant tank and the superconducting acceleration cavity.

6. A shielding body comprising:
a magnetic shield portion having a plate shape and formed of a magnetic body; and
a radiation shield portion formed as a film on at least one of inner and outer surfaces in the magnetic shield portion and formed of a material having a greater thermal conductivity than the magnetic body, wherein the radiation shield portion is formed on at least one of the inner and outer surfaces so as to form a plurality of layers, and a difference in thermal deformation amount between the layer and the magnetic shield portion increases in stages with increasing distance from the inner and outer surfaces.

* * * * *